United States Patent
Ciubotaru

(10) Patent No.: US 10,432,201 B2
(45) Date of Patent: Oct. 1, 2019

(54) LOW POWER ONE-PIN CRYSTAL OSCILLATOR WITH FAST START-UP

(71) Applicant: ARM LTD, Cambridge (GB)

(72) Inventor: Alexandru Aurelian Ciubotaru, Coconut Creek, FL (US)

(73) Assignee: Arm Limited, Cambridge (GB)

(*) Notice: Subject to any disclaimer, the term of this patent is extended or adjusted under 35 U.S.C. 154(b) by 9 days.

(21) Appl. No.: 15/695,493

(22) Filed: Sep. 5, 2017

(65) Prior Publication Data

US 2019/0074840 A1    Mar. 7, 2019

(51) Int. Cl.
*H03B 5/06* (2006.01)
*H03B 5/36* (2006.01)
(Continued)

(52) U.S. Cl.
CPC .......... *H03L 3/00* (2013.01); *H03B 5/06* (2013.01); *H03B 5/32* (2013.01); *H03B 5/364* (2013.01);
(Continued)

(58) Field of Classification Search
CPC ... H03B 5/06; H03B 5/30; H03B 5/32; H03B 5/36; H03B 5/364; H03B 2200/0094; H03L 3/00; H03L 5/00; H03L 5/02
(Continued)

(56) References Cited

U.S. PATENT DOCUMENTS 5,041,802 A * 8/1991 Wei .................. H03K 3/014
                                                    331/116 FE
5,481,228 A * 1/1996 Badyal ............... H03B 5/366
                                                    327/175
(Continued)

OTHER PUBLICATIONS

J. A. T. M. van den Homberg, "A universal 0.03-mm2 one-pin crystal oscillator in CMOS," in IEEE Journal of Solid-State Circuits, vol. 34, No. 7, pp. 956-961, Jul. 1999. doi: 10.1109/4.772410.
(Continued)

*Primary Examiner* — Levi Gannon
(74) *Attorney, Agent, or Firm* — Leveque IP Law, P.C.

(57) ABSTRACT

An oscillator circuit topology using a one-pin external resonator suitable for integrated-circuit low-voltage, low-power applications that require a fast-starting accurate clock is disclosed. The circuit incorporates a novel arrangement of a plurality of active transconductance cells that respond to a digital control and provide adjustable loop gain for the oscillator. A programmable number of start-up transconductance cells are engaged in the initial phase of the oscillation for temporarily increasing the loop gain and energizing the resonator, and are disengaged from the oscillator core once the oscillation level is sufficiently large. The start-up transconductance cells may be identical to the always-on transconductance cells in the oscillator core, or they may be scaled versions of those cells. In addition, a programmable number of identical or scaled transconductance cells may be provided in the oscillator core itself, for accommodating different resonators. Internal circuit implementations of the transconductance cells that enable their efficient combination for increasing the oscillator loop gain are also disclosed.

6 Claims, 17 Drawing Sheets

(51) Int. Cl.
  *H03L 3/00* (2006.01)
  *H03L 5/02* (2006.01)
  *H03B 5/32* (2006.01)
(52) U.S. Cl.
  CPC ........ *H03L 5/02* (2013.01); *H03B 2200/0088* (2013.01); *H03B 2200/0094* (2013.01)
(58) Field of Classification Search
  USPC ............... 331/116 FE, 116 R, 154, 158, 160, 331/172–174, 182, 183
  See application file for complete search history.

(56) References Cited

U.S. PATENT DOCUMENTS

| | | | | |
|---|---|---|---|---|
| 6,097,257 | A * | 8/2000 | Kadowaki | G04F 5/06 331/116 FE |
| 7,034,628 | B1 * | 4/2006 | Lu | H03B 5/06 331/158 |
| 7,808,334 | B2 * | 10/2010 | Yoshida | G01F 1/8431 310/329 |
| 7,868,710 | B1 * | 1/2011 | Farahvash | H03B 5/366 331/158 |
| 2004/0169562 | A1 * | 9/2004 | Novac | H03B 5/06 331/158 |
| 2006/0030358 | A1 * | 2/2006 | Kappes | G06F 1/3203 455/556.1 |
| 2011/0291767 | A1 * | 12/2011 | Ishikawa | H03K 3/0307 331/154 |

OTHER PUBLICATIONS

W. Zheng, M. Cai, X. He, K. Xu and Z. Chen, "Analysis and design of quickly starting crystal oscillator," 2015 IEEE 11th International Conference on ASIC (ASICON), Chengdu, 2015, pp. 1-4. doi:10.1109/ASICON.2015.7517135.

Vittoz, Eric, "Low-Power Crystal and MEMS Oscillators," Springer, Oct. 13, 2012, Chapter 6.

* cited by examiner

LOW POWER ONE-PIN CRYSTAL OSCILLATOR WITH FAST START-UP

BACKGROUND

The present invention relates generally to integrated circuits, and more particularly, to a one-pin low power crystal oscillator with fast start-up capability.

Modern clocking circuits in integrated circuits require stable frequency references (i.e., oscillators) with fast turn-on, small output noise, and low power consumption. Because of stringent frequency stability requirements, an external resonator with a high-quality factor (i.e., a quartz crystal) is typically employed in conjunction with active components in the integrated circuit for generating the reference oscillations. However, because the number of pins available in an integrated circuit for interfacing with other external circuits is limited, it is advantageous to use only one pin for connecting the resonator. Consequently, circuit implementations of oscillators that satisfy the foregoing requirements are challenging, especially in low-supply-voltage environments where the active devices (i.e., transistors) must operate with small headroom voltages.

Thus, there exists a need for a fast-starting, low-noise, and low-power, single-pin oscillator.

BRIEF DESCRIPTION OF THE DRAWINGS

The present disclosure is illustrated by way of example and not limited in the accompanying figures in which like reference numerals indicate similar elements and in which.

DETAILED DESCRIPTION

Figure 1:
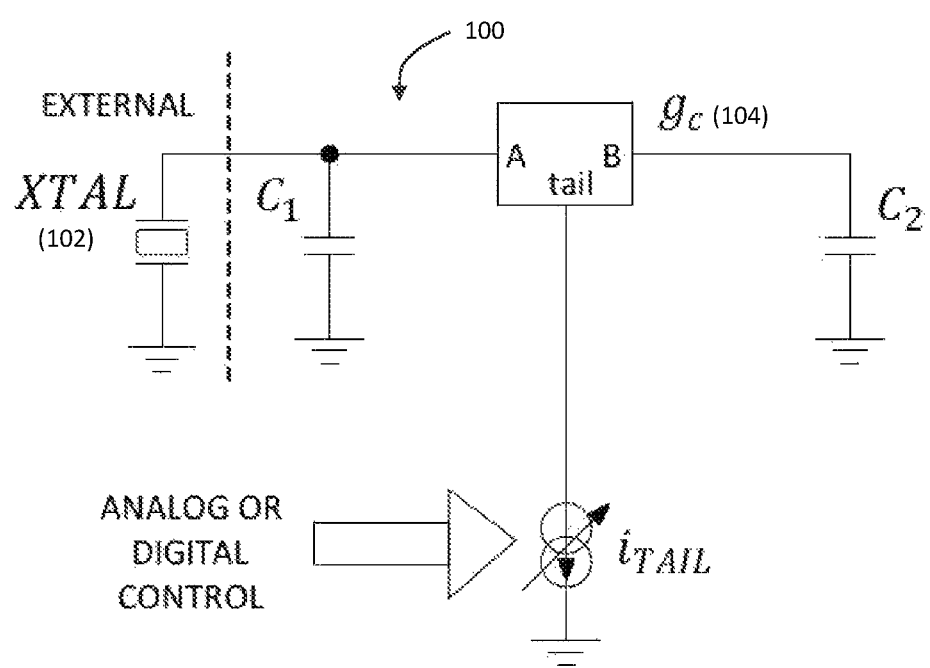
FIG. 1 is a schematic diagram illustrating a conceptual configuration of a fast-start-up, one-pin oscillator using a transconductance cell with a variable tail current.

Specific embodiments of the disclosure will now be described in detail with reference to the accompanying figures. For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

In the following detailed description of embodiments of the disclosure, numerous specific details are set forth in order to provide a more thorough understanding of the disclosure. However, it will be apparent to those skilled in the art that the disclosure may be practiced without these specific details. In other instances, well-known features have not been described in detail to avoid unnecessarily complicating the description.

It is to be understood that the terminology used herein is for the purposes of describing various embodiments in accordance with the present disclosure, and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used herein, the terms "about" or "approximately" apply to all numeric values, irrespective of whether these are explicitly indicated. Such terms generally refer to a range of numbers that one of skill in the art would consider equivalent to the recited values (i.e., having the same function or result). These terms may include numbers that are rounded to the nearest significant figure. In this document, any references to the term "longitudinal" should be understood to mean in a direction corresponding to an elongated direction of a personal computing device from one terminating end to an opposing terminating end. The terms "program," "software application," and the like, if used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system.

Referring to FIG. 1, there is depicted an exemplary circuit for controlling the loop gain to accelerate the start-up of a one-pin oscillator 100 having a resonator 102, where $g_c$ is a transconductance cell 104 with outputs "A" and "B". An illustrative circuit 200 for the transconductance cell $g_c$ 104 of FIG. 1 is shown in the schematic diagram of FIG. 2. Circuit 200 comprises a plurality of transistors $M_{P1}, \ldots, M_{P5}$, and $M_{N1}, \ldots, M_{N6}$ arranged as shown. The loop gain is controlled by adjusting the tail current $i_{TAIL}$ applied to $M_{N1}, M_{N2}$ using either analog or digital techniques. FIG. 3 graphically depicts an exemplary tail current $i_{TAIL}$ waveform 300 for accelerating the start-up of oscillator 100 shown in FIG. 1, where oscillator 100 is started at moment $t_{ON}$, and $i_{TAIL}$ has a temporarily large value $I_{START}$ until for a period until moment $t_S$. Because the transconductance of $g_c$ 104 is generally larger for greater values of $i_{TAIL}$, the relatively large $I_{START}$ temporarily increases the open-loop gain of the oscillator 100 and accelerates the oscillation build-up in the circuit. After the oscillations reach a sufficiently high level at moment $t_S$, $i_{TAIL}$ assumes a steady-state value $I_0$, which is relatively small but sufficiently large enough to safely maintain the oscillation in the circuit. To achieve overall low power consumption of the oscillator, both $I_{START}$ and $I_0$ and the time difference between $t_{ON}$ and $t_S$ should be minimized. However, in certain communication systems where the oscillator must be fully operational in a very short period of time, it is necessary for $I_{START}$ to be substantially larger than $I_0$.

Figure 3:
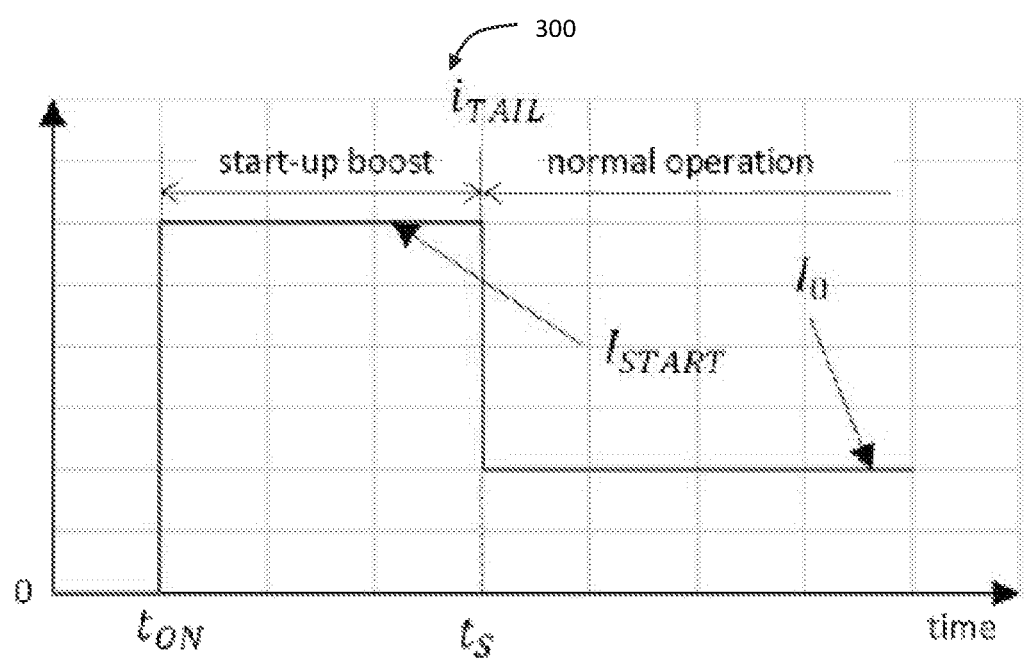
FIG. 3 graphically depicts a tail current waveform used for accelerating the start-up of the oscillator of FIG. 1 in accordance with the present disclosure.
Figure 4:
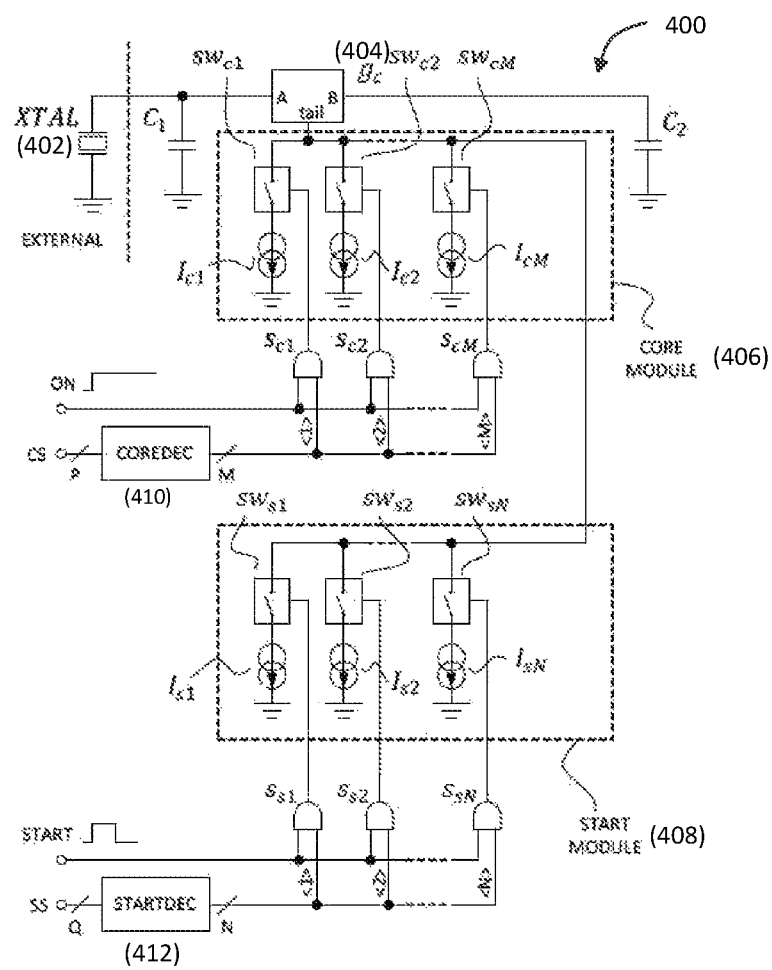
FIG. 4 is a schematic circuit diagram illustrating a conceptual digital control for the tail current of the oscillator of FIG. 1.

Referring now to FIG. 4, there is depicted a schematic circuit diagram 400 of an exemplary embodiment for digitally controlling the tail current $i_{TAIL}$ of the oscillator 402 of FIG. 1. In the sample embodiment, the currents of sources $I_{c1}, \ldots, I_{cM}$ and $I_{s1}, \ldots, I_{sN}$ may be selectively added via switches $sw_{c1}, \ldots, sw_{cM}$, and $sw_{s1}, \ldots, sw_{sN}$, respectively. Currents $I_{c1}, \ldots, I_{cM}$ and switches $sw_{c1}, \ldots, sw_{cM}$ may be grouped into a core module 406 coupled to transconductance cell $g_c$ 404 to provide a programmable steady-state value $I_0$ as graphically illustrated in FIG. 3. Similarly, currents $I_{s1}, \ldots, I_{sN}$ and switches $sw_{s1}, \ldots, sw_{sN}$ may be grouped into a start module 408 that, along with the core module 406, provides a programmable start value $I_{START}$ as also shown in FIG. 3. The steady-state current $I_0$ is programmed by a P-bit core select code CS applied to a core-select decoder COREDEC 410, which in turn provides desired logic levels to its M output lines coupled to respective logic AND gates $S_{c1}, \ldots, S_{cM}$. Similarly, current provided by the start module is programmed by a Q-bit core select code SS applied to a start-select decoder STARTDEC 412, which in turn provides desired logic levels to its N output lines coupled to respective logic AND gates $S_{s1}, \ldots, S_{sN}$.

Figure 2:
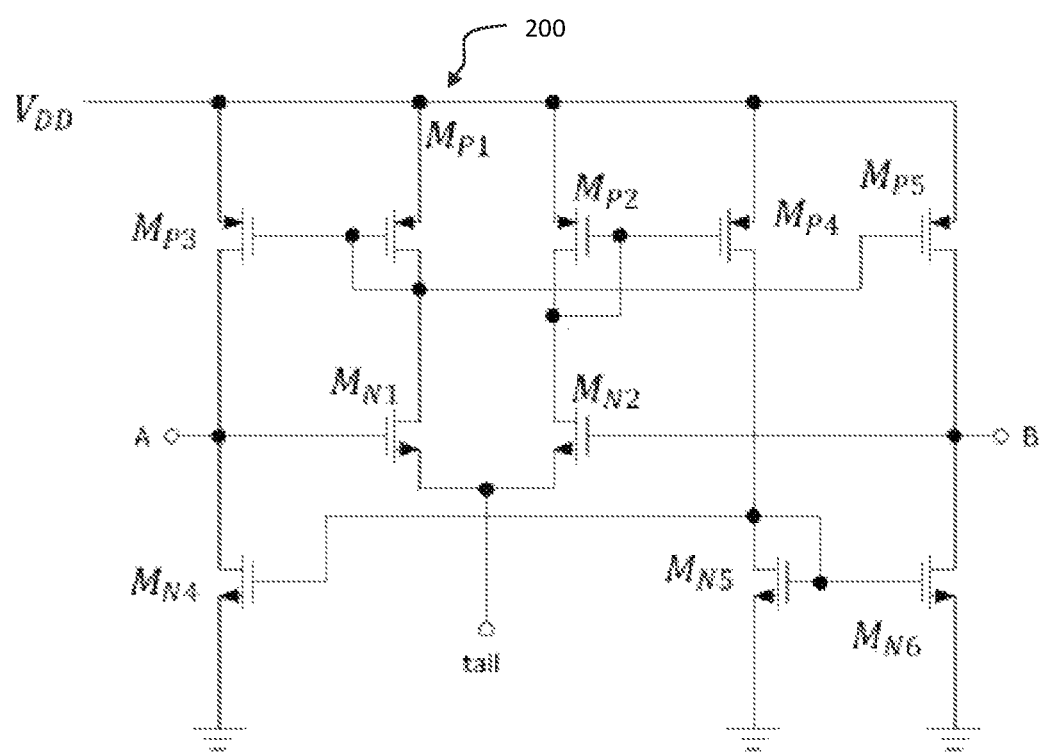
FIG. 2 is a schematic diagram illustrating an example of a detailed circuit configuration for the transconductor shown in FIG. 1 in accordance with the present disclosure.
Figure 5:
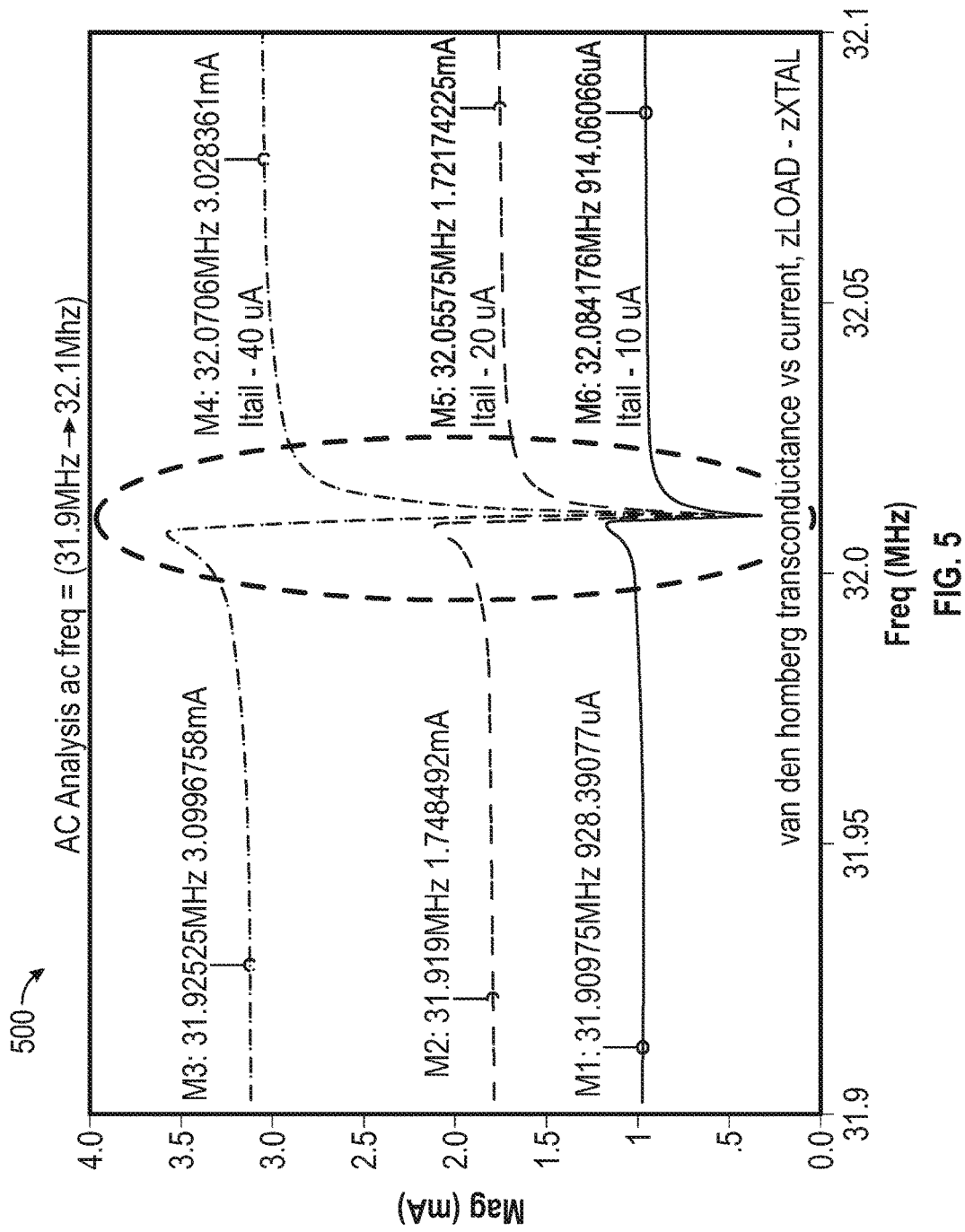
FIG. 5 graphically depicts representative plots of the transconductance of the oscillator in FIG. 1 in the presence of resonator load, over a wider frequency range around resonance, at different tail currents.
Figure 6:
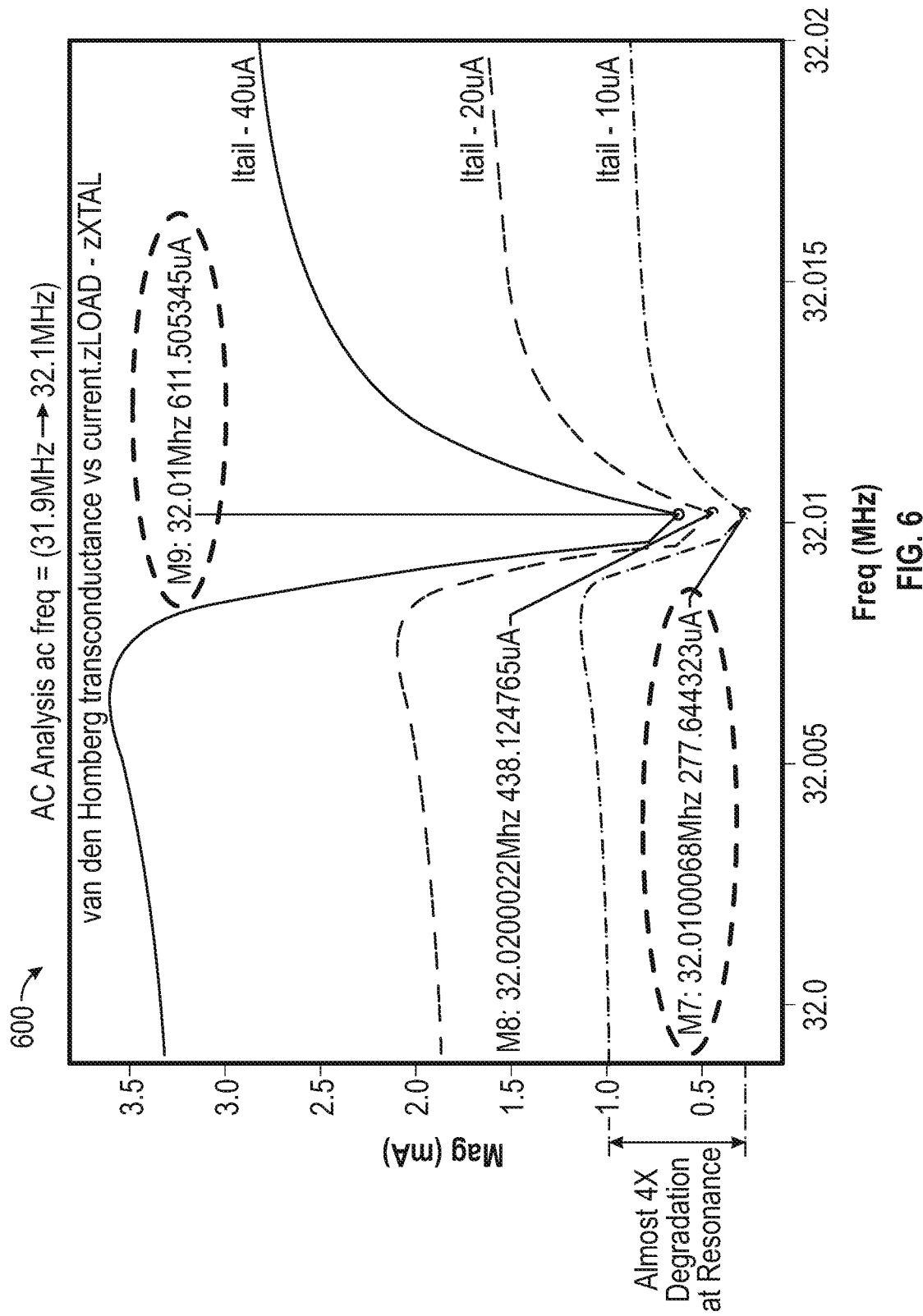
FIG. 6 graphically illustrates representative plots of the transconductance of the transconductor in the oscillator of FIG. 1 in the presence of resonator load over a narrower frequency range at resonance, at different tail currents.

It has been found that the embodiment depicted in FIG. 1 and FIG. 2 exhibits a typical sharp decrease in the transconductance of the oscillator 100 in the presence of the resonator load at the resonance frequency as graphically illustrated in the plots 500, 600 shown in FIGS. 5 and 6, respectively. This occurs despite the fact that the transconductance responds normally to changes in the tail current outside resonance, i.e., the transconductance depends linearly on the DC tail current of the transconductor. Thus, for an increase in the tail current by a factor of 4, there is a corresponding factor of 4 increase in the transconductance outside resonance. In addition to the decrease itself at the resonance frequency, which negatively impacts the oscillator loop gain and start-up time, the transconductance at resonance does not depend linearly on the DC tail current of the transconductor. In this regard, for a 4 factor increase in the tail current, the transconductance only increases by a factor of about 2, or 611/277 as illustrated in FIG. 6. In the sense that any start-up acceleration of the oscillator by means of increasing the tail current as shown in FIG. 1 comes at a significant cost from a current consumption standpoint (i.e., a large current must be consumed for a relatively modest decrease of the start-up time), this is a drawback. This characteristic is explicated by reference to the simplified circuit 700 depicted in the schematic of FIG. 7, where the dominant transistor parasitics ($C_{gd}$, the gate-drain capacitance) of the output stage of the transconductor are explicitly shown. In this connection, if $R_L$ denotes the relatively-large resistive impedance of the crystal load at resonance, it can be shown that the output current $i_L$ as a function of current $I_{in}$ (the output current of the transconductor input stage $G_{mI\ N}$) can be written as:

$$\frac{i_L}{i_{in}} \simeq \frac{g_{m2}}{g_{m1} + sC_{gd}g_{m2}R_L} \simeq \frac{M}{1 + sC_{gd}R_LM}. \tag{1}$$

Figure 7:
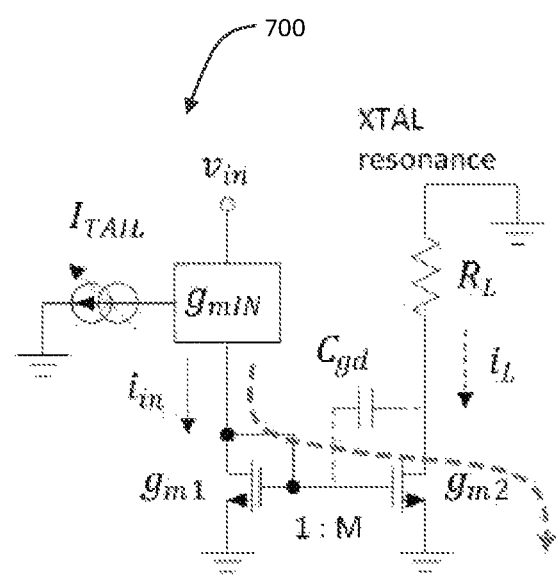
FIG. 7 is a schematic diagram of a circuit for analyzing the behavior of a transconductance cell such as shown in FIG. 2, at the parallel resonance frequency, in the presence of transistor parasitics.

Accordingly, from the above it follows that the equivalent transconductance $g_{mEQ}$ of the transconductor shown in FIG. 7 (which is a simplified concept of the transconductor 200 shown in FIG. 2) can be calculated as:

$$g_{mEQ} = \frac{i_L}{v_{in}} \simeq g_{mIN} \frac{M}{1 + sC_{gd}R_LM}. \tag{2}$$

From eq. (2) it can be seen, that at resonance, $g_{mEQ}$ is reduced because of a very large $R_L$ and non-negligible $C_{gd}$. In addition, to accommodate a large current $I_{TAIL}$ (for large $g_{mEQ}$ and fast start-up), it becomes necessary to employ larger transistors, which increases $C_{gd}$ and further reduces $g_{mEQ}$.

Figure 8:
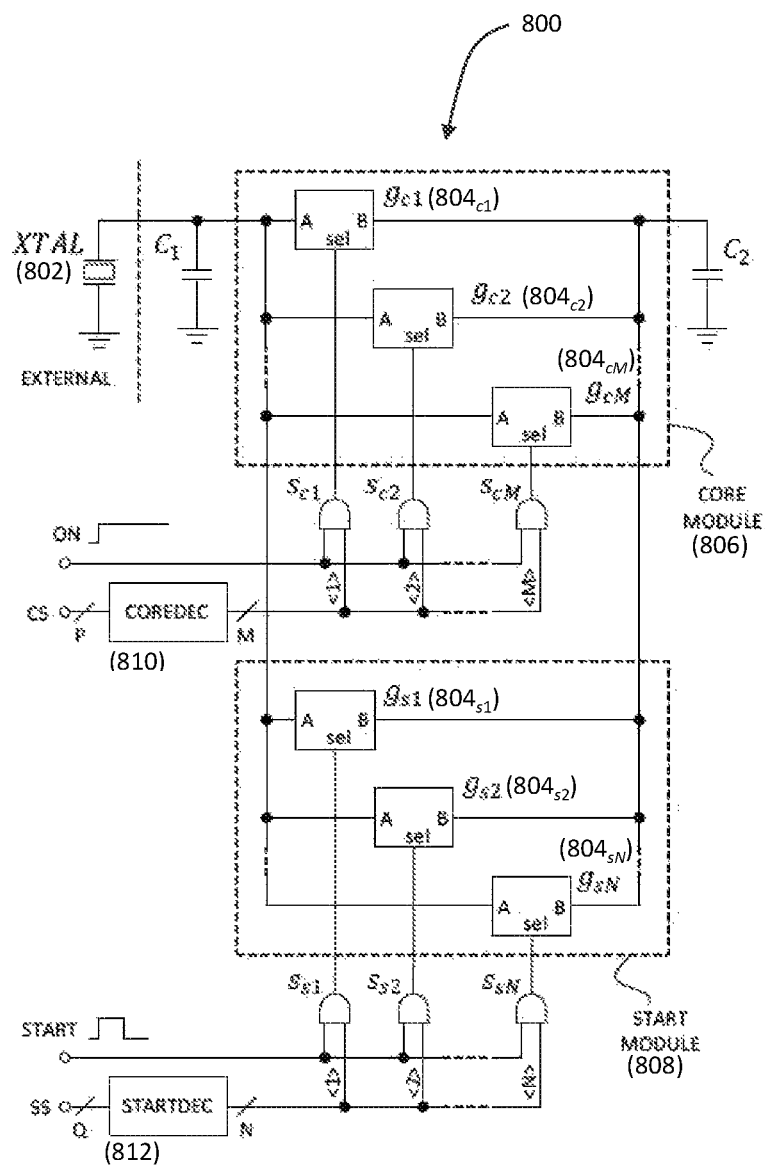
FIG. 8 is a schematic diagram illustrating an embodiment of a low-power, one-pin, fast start-up crystal oscillator in accordance with the present disclosure, using digitally-controlled transconductance modules.

In accordance with an example embodiment of the disclosure as shown in the schematic of FIG. 8, there is depicted an exemplary embodiment of a low-power, one-pin, fast start-up crystal oscillator 800 incorporating digitally-controlled transconductance modules. The oscillator circuit 800 generally includes a resonator 802, a core module 806 and a start module 808. As in the circuit depicted in FIG. 4, a plurality of core transconductance cells $g_{c1}, \ldots, g_{cM}$ ($804_{c1}, \ldots, 804_{cM}$) are grouped into core module 806, and a plurality of startup transconductance cells $g_{s1}, \ldots, g_{sN}$ ($804_{s1}, \ldots, 804_{sN}$) are grouped into start module 808. The startup transconductance cells $g_{s1}, \ldots, g_{sN}$ ($804_{s1}, \ldots, 804_{sN}$) may be identical to the core transconductance cells $g_{c1}, \ldots, g_{cM}$ ($804_{c1}, \ldots, 804_{cM}$), or they may be scaled versions of core transconductance cells $g_{c1}, \ldots, g_{cM}$ ($804_{c1}, \ldots, 804_{cM}$). Each of the transconductance cells $g_{c1}, \ldots, (804_{c1}, \ldots, 804_{cM})$ and $g_{s1}, \ldots, g_{sN}$ ($804_{s1}, \ldots, 804_{sN}$) may be selectively added (i.e., engaged) or deselected (i.e., disengaged) responsive to signals output from logic AND gates $S_{c1}, \ldots, S_{cM}$, and $S_{s1}, \ldots, S_{sN}$, respectively. Further, the oscillator 800 is provided with a core select decoder COREDEC 810 coupled via M output lines to logic AND gates $S_{c1}, \ldots, S_{cM}$, and a start select decoder STARTDEC 812 coupled via M output lines to logic AND gates $S_{s1}, \ldots, S_{sN}$. Each decoder is configured to function with a corresponding number of bits in a manner analogous to the configuration shown in FIG. 4. However, in this embodiment, the plurality of transconductance cells $g_{c1}, \ldots, g_{cM}$ ($804_{c1}, \ldots, 804_{cM}$) and $g_{s1}, \ldots, g_{sN}$ ($804_{s1}, \ldots, 804_{sN}$) can be selected in response to the digital core-select code CS from core select decoder COREDEC 810, and the digital start-select code SS from the start select decoder STARTDEC 812, respectively. In this manner, the outputs of decoders COREDEC 810 and STARTDEC 812 may individually select or deselect each of the transconductance cells $g_{c1}, \ldots, g_{cM}$ ($804_{c1}, \ldots, 804_{cM}$) and $g_{s1}, \ldots, g_{sN}$ ($804_{s1}, \ldots, 804_{sN}$) in core and start modules 806, 808, respectively, via enable signals ON and START, respectively. During the startup phase of the oscillation, to provide the necessary oscillator loop-gain for a rapid turn-on some of the cells in the core module $g_{c1}, \ldots, g_{cM}$ ($804_{c1}, \ldots, 804_{cM}$) may advantageously be selected concurrently with some of the cells in the start-up module $g_{s1}, \ldots, g_{sN}$ ($804_{s1}, \ldots, 804_{sN}$) when both the ON and START control signals are at a HIGH logic level. After a predetermined time, or when the oscillation is assessed to have a sufficiently large level, the cells in the start module can be disengaged by taking the START control signal to a LOW logic level. The transconductance cells $g_{c1}, \ldots, g_{cM}$ ($804_{c1}, \ldots, 804_{cM}$) and $g_{s1}, \ldots, g_{sN}$ ($804_{s1}, \ldots, 804_{sN}$) are engaged or disengaged via a selection control signal "sel" received at the cell from a corresponding logic AND gate $S_{c1}, \ldots, S_{cM}$, and $S_{s1}, \ldots, S_{sN}$, respectively.

Figure 9:
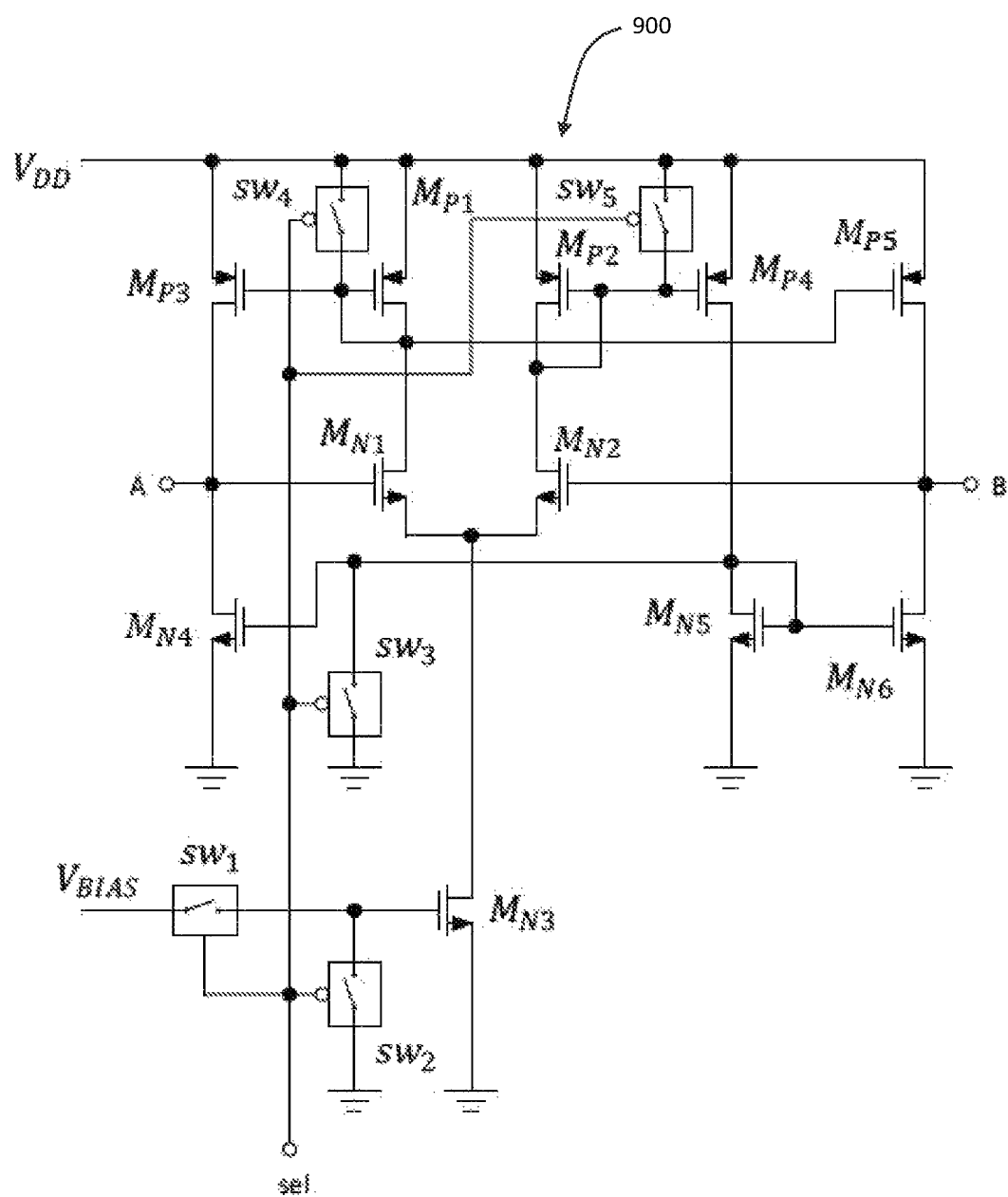
FIG. 9 is a schematic diagram depicting a detailed circuit configuration for the transconductor used in the embodiment of FIG. 8 in accordance with the present disclosure.
Figure 10:
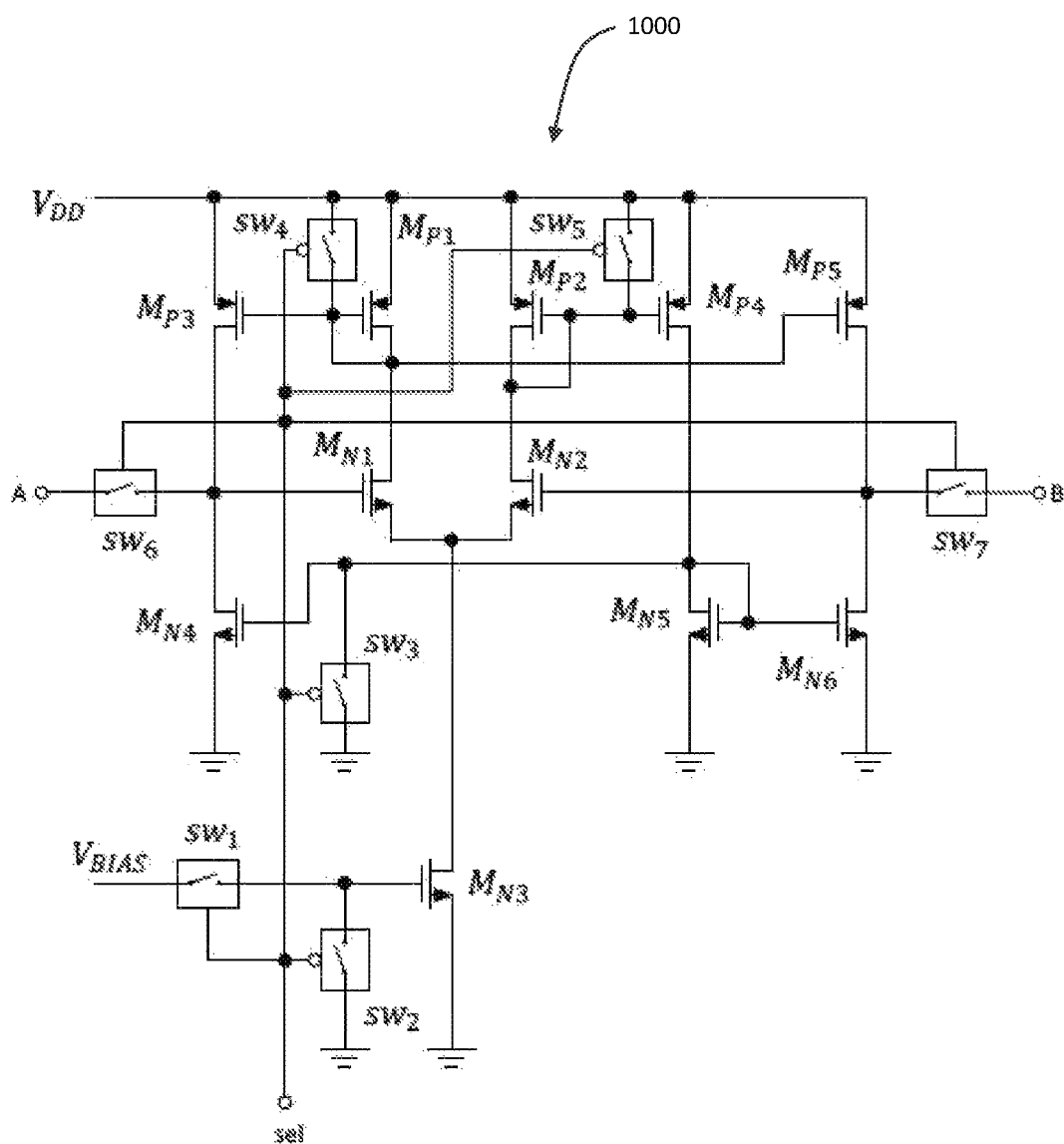
FIG. 10 is a schematic diagram depicting another detailed circuit configuration for the transconductor used in the embodiment of FIG. 8 in accordance with the present disclosure.

Referring now to FIGS. 9 and 10, there are shown exemplary circuit configurations for the transconductance cells $g_{c1}, \ldots, g_{cM}$ ($804_{c1}, \ldots, 804_{cM}$) and $g_{s1}, \ldots, g_{sN}$ ($804_{s1}, \ldots, 804_{sN}$) of the oscillator 800 illustrated in FIG. 8 and described above. The circuit 900 illustrated in FIG. 9 is like the circuit shown in FIG. 2, where the common circuit elements have the same function(s). Transistor $M_{N3}$, as depicted in the circuit of FIG. 9, is added to provide a DC bias to the transconductor. In addition, switches $sw_1, \ldots, sw_5$ are provided to enable the efficient selection or deselection of the transconductor according to the selection control signal sel from the corresponding logic AND gate as shown in FIG. 8. With reference now to FIG. 10 there is depicted a modified transconductor circuit 1000 that is like the transconductor circuit 900 shown in FIG. 9, but where output switches $sw_6$, $sw_7$ are added between the active circuitry and the transconductor outputs "A" and "B". This configuration 1000 provides for increased isolation of the circuit when the transconductor is disengaged.

Figure 11:
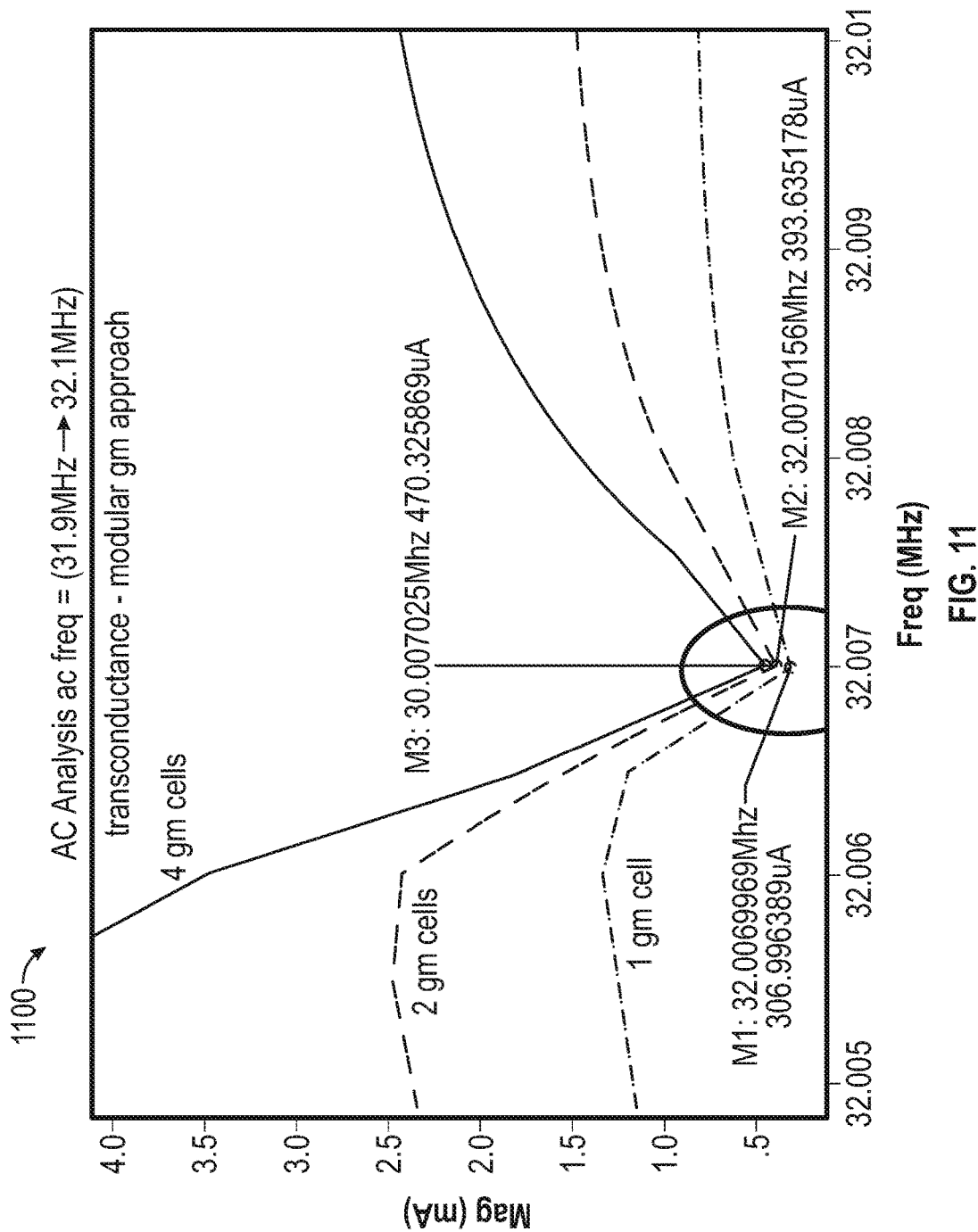
FIG. 11 graphically depicts exemplary plots of the transconductance of the transconductor used in the embodiment shown in FIG. 8 that employs the transconductance cells depicted in FIG. 9 or 10, in the presence of a resonator load over a narrow frequency range around resonance, for different numbers of identical cells that are selected.
Figure 12:
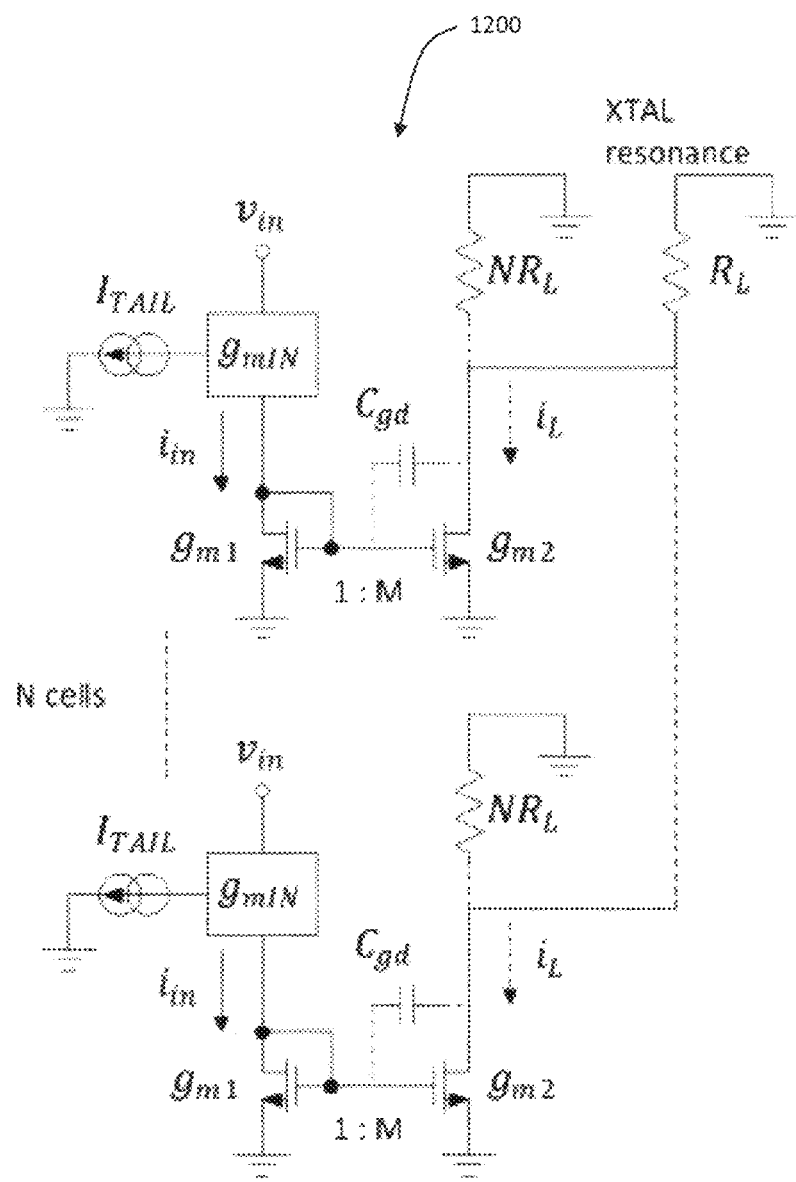
FIG. 12 is a schematic diagram for analyzing the circuit behavior of a transconductance cell such as shown in FIG. 9 or 10, which is connected as in the embodiment shown in FIG. 8, at the parallel resonance frequency in the presence of transistor parasitics.

The combined parasitics of the individual transconductors can have a degrading effect on performance. In this regard, referring now to FIG. 11 there is depicted a graphical plot 1100 of the transconductance of the oscillator circuit shown in FIG. 8, incorporating the transconductance cells shown in FIG. 9 or 10. From FIG. 11, it can be seen that in addition to a sharp decrease in transconductance at the resonance frequency (similar to the decrease shown in FIG. 6), the transconductance at resonance doesn't linearly depend on the number of selected cells, and the control nonlinearity is worse than the control nonlinearity illustrated in FIG. 6. Specifically, for a factor of 4 increase in the number of cells, the increase in transconductance is less than about 2, or 470/305, although the control linearity is maintained outside resonance. This behavior can be explained with reference to the simplified circuit 1200 of FIG. 12, where N identical transconductance cells of the type shown in FIG. 7 are connected in parallel. If $R_L$ again denotes the relatively large resistive impedance of the crystal load at resonance, $N \cdot R_L$ resistances can be equivalently connected as the individual loads of the individual cells as shown. In this way, the equivalent transconductance $g_{mEQ}$ of the transconductor shown in the schematic 1200 of FIG. 12 (which is a simplified concept of the transconductor shown in FIG. 8 using transconductance cells as depicted in FIG. 9 or 10) can be calculated as:

$$g_{mEQ} \simeq g_{mIN} \frac{MN}{1 + sC_{gd}R_L MN}. \qquad (3)$$

The effect of $C_{gd}$ is exacerbated by N, because each individual cell now sees an $N \cdot R_L$ load instead of just $R_L$, even though N output currents are summed. To obtain a large $g_{mEQ}$, it is necessary to increase N. However, from eq. (3), it can be seen, that a limit $(G_{mIN}/(sC_{gd}R_L))$ is quickly reached at high frequencies, even for a relatively small N, particularly if M is large. This effect can be mitigated as described below.

Figure 13:
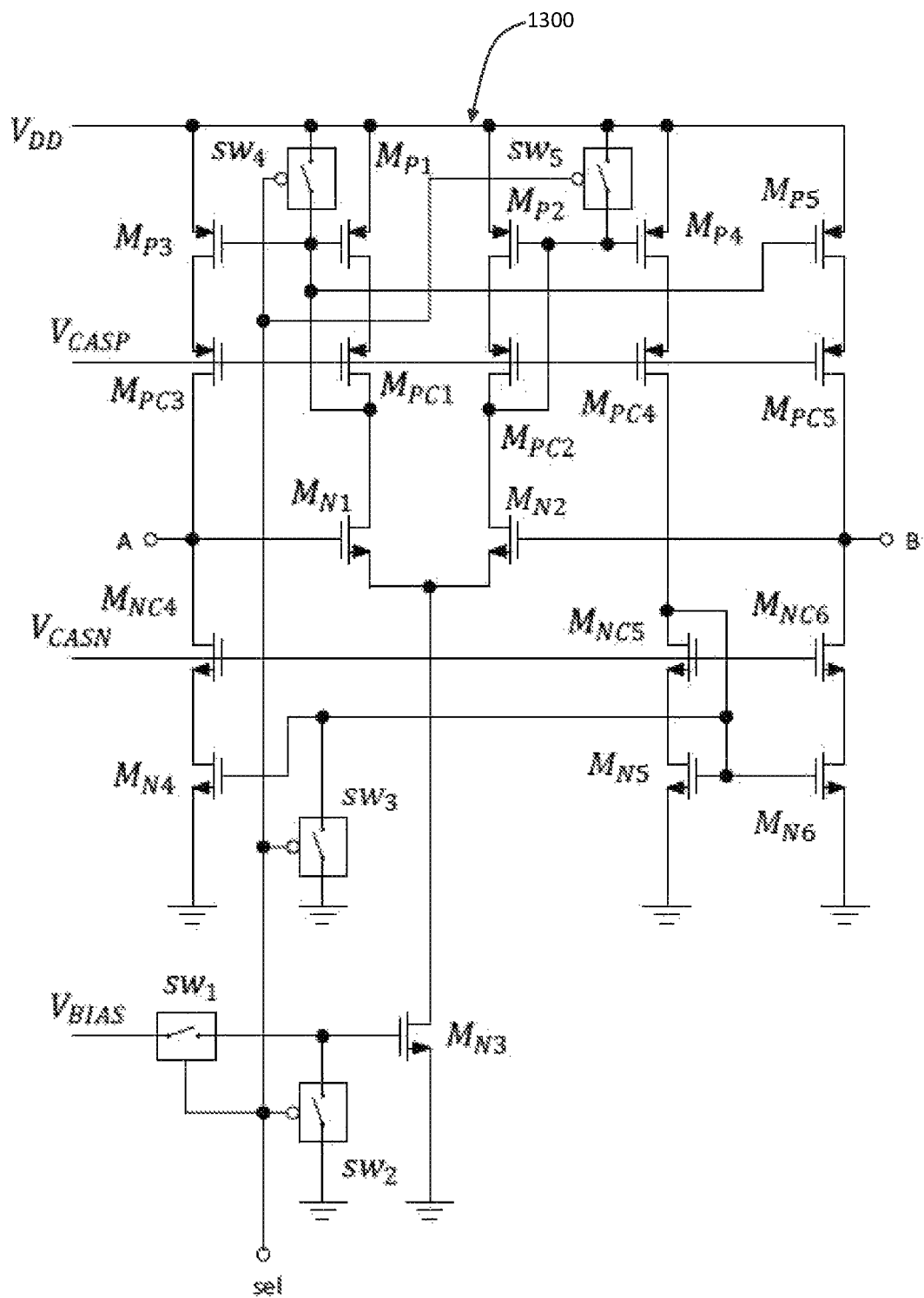
FIG. 13 is a schematic diagram illustrating a detailed circuit configuration for the transconductor cells used in the embodiment of FIG. 8, in accordance with the present disclosure.
Figure 14:
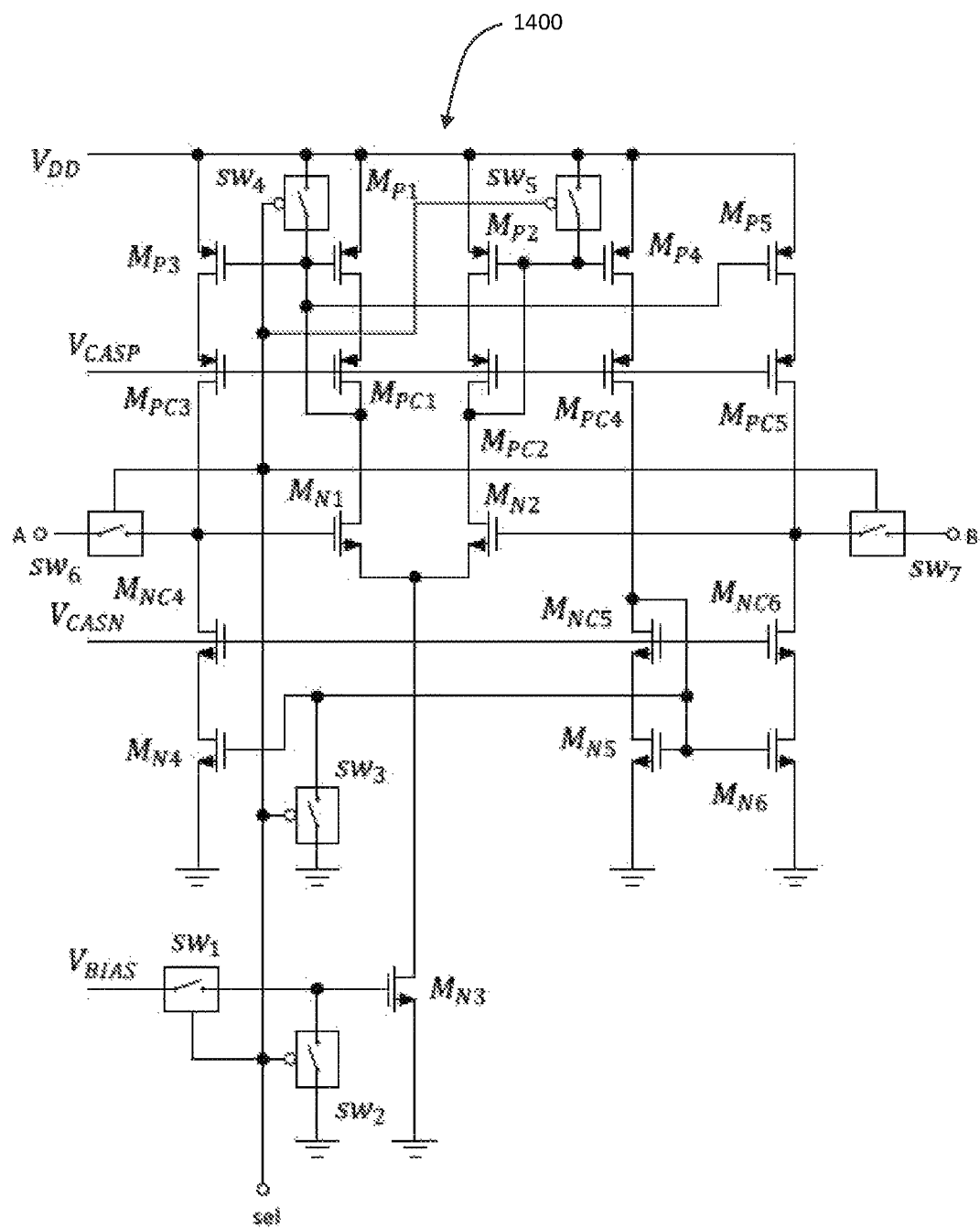
FIG. 14 is a schematic diagram illustrating another detailed circuit configuration for the transconductor cells used in the embodiment of FIG. 8, in accordance with the present disclosure.

Referring now to FIG. 13, in accordance with another embodiment of the disclosure there is depicted a detailed circuit configuration 1300 of an exemplary embodiment that minimizes the combined effect of the parasitic capacitances $C_{gd}$ for the transconductance cells utilized in the architecture 800 shown in FIG. 8. In the transconductor circuit 1300 of FIG. 13, the parasitic effect is diminished by adding cascode transistors $M_{NC4}$, $M_{NC5}$, $M_{NC6}$, and $M_{PC1}$, $M_{PC2}$, $M_{PC3}$, $M_{PC4}$, $M_{PC5}$ to the circuit of FIG. 9. All other elements of the circuit depicted in FIG. 13 retain the same roles and notations as those shown in FIG. 9. Similarly, in accordance with another embodiment of the disclosure, FIG. 14 illustrates an alternative circuit configuration 1400 for the transconductance cells employed in the circuit 800 of FIG. 8. This configuration 1400 is like the arrangement shown in FIG. 13, but with a modification to the transconductor circuit 1300 where output switches $sw_6$, $sw_7$ are added between the active circuitry and the transconductor outputs. Like the embodiment depicted in FIG. 10, this configuration provides increased isolation of the circuit when the transconductor is disengaged. Further, as in the circuit 1300 of FIG. 13, the combined effect of parasitic capacitances $C_{gd}$ is minimized by adding cascode transistors $M_{NC4}$, $M_{NC5}$, $M_{NC6}$, and $M_{PC1}$, $M_{PC2}$, $M_{PC3}$, $M_{PC4}$, $N_{PC5}$. All the other circuit components shown in FIG. 14 retain the same roles and notations as those shown in FIG. 10.

Figure 15:
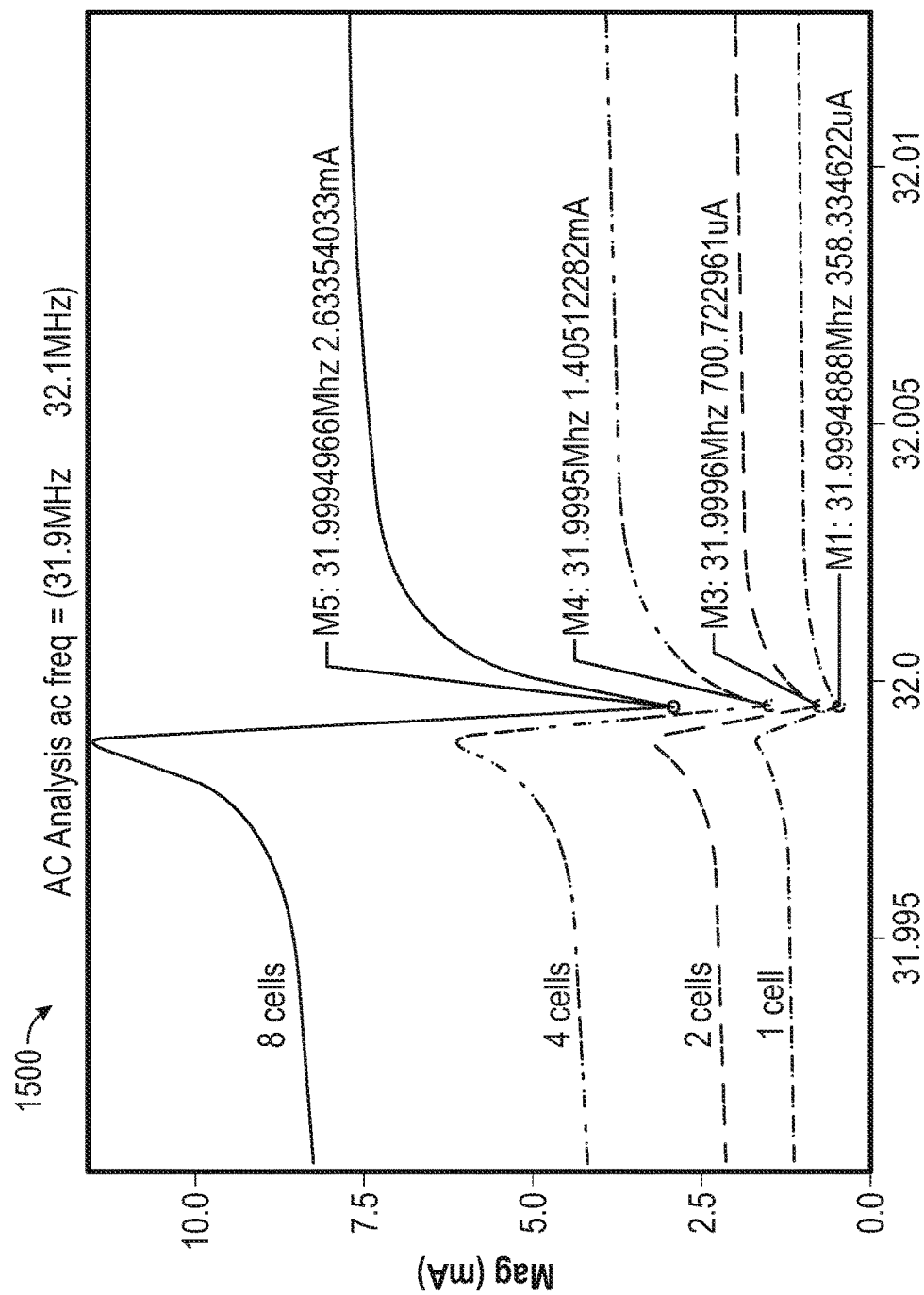
FIG. 15 graphically depicts exemplary plots of the transconductance of the oscillator transconductor in the embodiment of FIG. 8 using the transconductance cells shown in FIG. 13 or 14, in the presence of resonator load over a narrow frequency range around resonance, for different numbers of identical cells selected.
Figure 16:
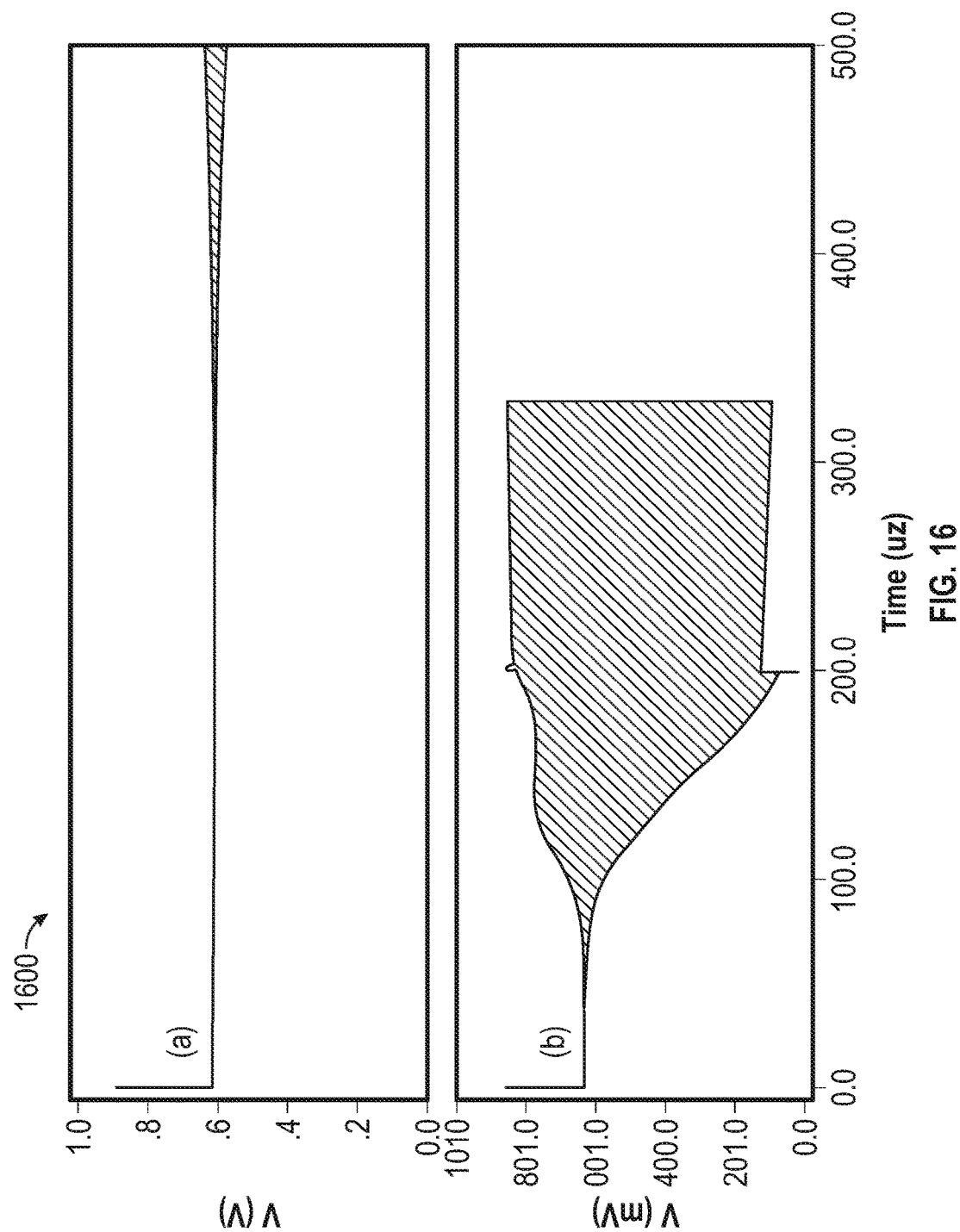
FIG. 16 graphically depicts exemplary start-up behavior of the oscillator shown in FIG. 8 using the transconductance cells of FIG. 13 or 14, in a first case (a) where only one transconductance cell is engaged (a) vs. a second case (b) where three additional transconductance cells are engaged for the first 200 μs (i.e., a start-up period)

With reference now to FIGS. 15 and 16, there are shown graphical plots of improved performance in the oscillator architecture 800 shown in FIG. 8, incorporating the transconductor circuit configurations 1300, 1400 illustrated in FIGS. 13 and 14, respectively. FIG. 15 pictorially illustrates exemplary plots 1500 of the combined transconductance for different numbers of identical cells that are selected by the logic gates. As can be seen, as a greater number of cells are engaged a proportional transconductance improvement is exhibited. Consequently, the start-up time of an oscillator using this architecture as disclosed herein can be significantly improved. As graphically illustrated by the plot 1600 in FIG. 16, it can be appreciated that engaging a relatively small number of additional cells provides improved startup performance while only consuming relatively small additional amounts of energy. Specifically, FIG. 16 shows exemplary startup behavior for the oscillator 800 of FIG. 8 using the transconductance cells of FIG. 13 or 14 for two illustrative cases: a first case (a) where a single transconductance cell is engaged, and a second case (b) where three additional transconductance cells are engaged for the first 200 μs and then disconnected thereafter. As shown in the plot of FIG. 16, engaging multiple transconductance cells in the startup phase (case (b)) for the first 200 μs results in a rapid buildup in the oscillation. By way of comparison, there is a relatively slow oscillation buildup when only a single transconductance cell was engaged (case (a)). Thus, it can be appreciated that selectively engaging and disengaging a plurality of startup transconductance cells in accordance with the disclosure advantageously provides a faster start-up time for the oscillator with relatively low additional power consumption.

Figure 17:
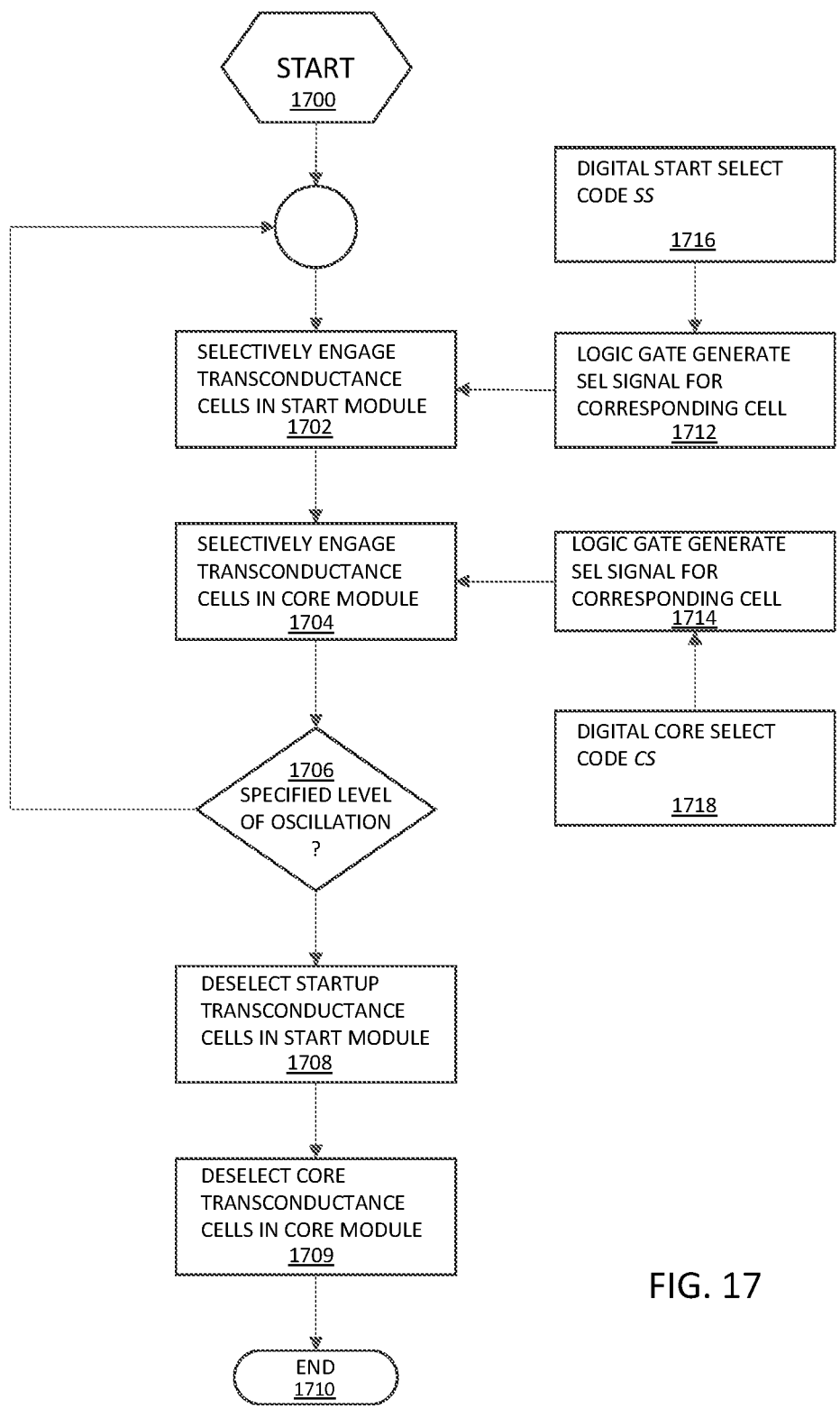
FIG. 17 is a flow diagram of a method for operating an oscillator in accordance with the present disclosure.

Referring now to FIG. 17, there is depicted a flow diagram of an exemplary method of energizing an oscillator circuit including a resonator. The method starts at block 1700, and proceeds to block 1702, where at least one of a plurality of startup transconductance cells in a startup module are selectably engaged. At block 1704, a plurality of core transconductance cells in a core module coupled to the resonator and the startup module are selectably engaged. The startup transconductance cells and core transconductance cells may be engaged simultaneously in blocks 1702 and 1704. In block 1706, if a specified level of oscillation for the resonator is reached, then the at least one startup transconductance cell in the start module is disengaged in block 1708. Likewise, at least one core transconductance cell may optionally be disengaged in block 1709 so long as the oscillation continues at the specified level. The method then terminates at block 1710. If the specified level of oscillation has not yet been reached in block 1706, then the method loops back to blocks 1702/1704 where either additional startup and core transconductance cells are selectably engaged, or the process continues with the same number of transconductance cells engaged for a period of time until the specified level of oscillation is reached in block 1706.

In accordance with a further embodiment of the disclosure, the method further includes engaging and disengaging the at least one of the plurality of startup transconductance cells in blocks 1702, 1708 responsive to a signal generated in block 1712 by a corresponding logic gate coupled to the startup transconductance cell. Similarly, the method further includes engaging and disengaging the at least one of the plurality of core transconductance cells in blocks 1704, 1709 responsive to a signal generated in block 1714 by a corresponding logic gate coupled to the core transconductance cell in block 1704.

In accordance with another embodiment of the disclosure, the method further includes, at block 1716, signaling the logic gate coupled to a corresponding startup transconductance cell with a digital start-select code from a start select decoder to selectably engage and disengage the startup transconductance cell. Similarly, the method further includes, at block 1718, signaling the logic gate coupled to a corresponding core transconductance cell with a digital core-select code from a core select decoder to selectably engage and disengage the core transconductance cell.

Accordingly, some features of the disclosed embodiments are set out in the following numbered items:

1. An oscillator circuit, comprising: a start module having a plurality of startup transconductance cells, each startup transconductance cell coupled to a corresponding logic gate for selectably engaging and disengaging the startup transconductance cell; and a core module coupled to a resonator and the startup module, the core module having a plurality of core transconductance cells, each core transconductance cell coupled to a corresponding logic gate for selectably engaging and disengaging the core transconductance cell, a programmable number of the plurality of startup transconductance cells engageable in an initial phase of oscillation to temporarily increase loop gain and energize the resonator, the programmable number of startup transconductance cells disengageable when a specified level of oscillation is reached.

2. The oscillator circuit of claim 1, further comprising: a start select decoder that generates a digital start-select code, the start select decoder coupled to the logic gates for selectably engaging and disengaging each start transconductance cell; and a core select decoder that generates a digital core-select code, the core select decoder coupled to the logic gates for selectably engaging and disengaging each core transconductance cell.

3. The oscillator circuit of claim 2, where each startup transconductance cell comprises a plurality of cascode transistors.

4. The oscillator circuit of claim 2, where each core transconductance cell comprises a plurality of cascode transistors.

5. The oscillator circuit of claim 3, where each startup transconductance cell further comprises a plurality of switches responsive to a selection control signal from the corresponding logic gate.

6. The oscillator circuit of claim 4, where each core transconductance cell further comprises a plurality of switches responsive to a selection control signal from the corresponding logic gate.

7. The oscillator circuit of claim 5, where each startup transconductance cell further comprises a pair of output switches for isolating outputs of each startup transconductance cell when the startup transconductance cell is disengaged.

8. The oscillator circuit of claim 6, where each core transconductance cell further comprises a pair of output switches for isolating outputs of each core transconductance cell when the core transconductance cell is disengaged.

9. An oscillator circuit, comprising: a start module having a plurality of startup transconductance cells, each startup transconductance cell coupled to a corresponding logic gate for selectably engaging and disengaging the startup transconductance cell; a core module coupled to a resonator and the startup module, the core module having a plurality of core transconductance cells, each core transconductance cell coupled to a corresponding logic gate for selectably engaging and disengaging the core transconductance cell; a start select decoder that generates a digital start-select code, the start select decoder coupled to the logic gates for selectably engaging and disengaging each startup transconductance cell; and a core select decoder that generates a digital core-select code, the core select decoder coupled to the logic gates for selectably engaging and disengaging each core transconductance cell, a programmable number of the startup transconductance cells engageable in an initial phase of oscillation to temporarily increase loop gain and energize the resonator, the programmable number of startup transconductance cells disengageable when a specified level of oscillation is reached.

10. The oscillator circuit of claim 9, where each startup transconductance cell comprises a plurality of cascode transistors.

11. The oscillator circuit of claim 9, where each core transconductance cell comprises a plurality of cascode transistors.

12. The oscillator circuit of claim 10, where each startup transconductance cell further comprises a plurality of switches responsive to a selection control signal from the corresponding logic gate.

13. The oscillator circuit of claim 11, where each core transconductance cell further comprises a plurality of switches responsive to a selection control signal from the corresponding logic gate.

14. The oscillator circuit of claim 12, where each startup transconductance cell further comprises a pair of switches for isolating outputs of each startup transconductance cell when the startup transconductance cell is disengaged.

15. The oscillator circuit of claim 13, where each core transconductance cell further comprises a pair of switches for isolating outputs of each core transconductance cell when the core transconductance cell is disengaged.

16. A method of energizing an oscillator circuit, comprising: until a specified level of oscillation for a resonator is reached, selectably engaging at least one of a plurality of startup transconductance cells in a start module; selectably engaging at least one of a plurality of core transconductance cells in a core module coupled to the resonator and the start module; and upon reaching the specified level of oscillation for the resonator, selectably disengaging the at least one of the plurality of startup transconductance cells in the start module.

17. The method for energizing the oscillator circuit of claim 16, further comprising engaging and disengaging the at least one of the plurality of startup transconductance cells responsive to a signal from a corresponding logic gate coupled to the startup transconductance cell.

18. The method for energizing the oscillator circuit of claim 16, further comprising engaging and disengaging the at least one of the plurality of core transconductance cells responsive to a signal from a corresponding logic gate coupled to the core transconductance cell.

19. The method for energizing the oscillator circuit of claim 17, further comprising signaling a logic gate coupled to a corresponding startup transconductance cell with a digital start-select code from a start select decoder to selectably engage and disengage the startup transconductance cell.

20. The method for energizing the oscillator circuit of claim 18, further comprising signaling a logic gate coupled to a corresponding core transconductance cell with a digital core-select code from a core select decoder to selectably engage and disengage the core transconductance cell.

A novel and efficient fast start-up crystal oscillator has been disclosed. Having thus described the invention of the present application in detail and by reference to embodiments thereof, it will be apparent that modifications and variations are possible without departing from the scope of the invention defined in the appended claims as follows.

I claim:
1. An oscillator circuit, comprising:
a start module having:
  a plurality of startup transconductance cells, each startup transconductance cell coupled to a corresponding logic gate for selectably engaging and disengaging the startup transconductance cell and each startup transconductance cell further comprising:
  a plurality of cascode transistors;
  a plurality of switches responsive to a selection control signal from the corresponding logic gate; and
  a pair of output switches for isolating outputs of each startup transconductance cell when the startup transconductance cell is disengaged;
a core module coupled to a resonator and the startup module, the core module having a plurality of core transconductance cells, each core transconductance cell coupled to a corresponding logic gate for selectably engaging and disengaging the core transconductance cell and further comprising:
  a plurality of cascode transistors;
  a plurality of switches responsive to a selection control signal from the corresponding logic gate; and
  a pair of output switches for isolating outputs of each core transconductance cell when the core transconductance cell is disengaged,
a programmable number of the plurality of startup transconductance cells engageable in an initial phase of oscillation to temporarily increase loop gain and energize the resonator, the programmable number of startup transconductance cells disengageable when a specified level of oscillation is reached.

2. The oscillator circuit of claim 1, further comprising:
a start select decoder that generates a digital start-select code, the start select decoder coupled to the logic gates for selectably engaging and disengaging each start transconductance cell; and
a core select decoder that generates a digital core-select code, the core select decoder coupled to the logic gates for selectably engaging and disengaging each core transconductance cell.

3. An oscillator circuit, comprising:
a start module having:
  a plurality of startup transconductance cells, each startup transconductance cell coupled to a corresponding logic gate for selectably engaging and disengaging the startup transconductance cell and each startup transconductance cell further comprising:
  a plurality of cascode transistors;
  a plurality of switches responsive to a selection control signal from the corresponding logic gate; and a pair of output switches for isolating outputs of each startup transconductance cell when the startup transconductance cell is disengaged;

a core module coupled to a resonator and the startup module, the core module having a plurality of core transconductance cells, each core transconductance cell coupled to a corresponding logic gate for selectably engaging and disengaging the core transconductance cell and further comprising:

a plurality of cascode transistors;

a plurality of switches responsive to a selection control signal from the corresponding logic gate; and a pair of output switches for isolating outputs of each core transconductance cell when the core transconductance cell is disengaged;

a start select decoder that generates a digital start-select code, the start select decoder coupled to the logic gates for selectably engaging and disengaging each startup transconductance cell; and a core select decoder that generates a digital core-select code, the core select decoder coupled to the logic gates for selectably engaging and disengaging each core transconductance cell, a programmable number of the startup transconductance cells engageable in an initial phase of oscillation to temporarily increase loop gain and energize the resonator, the programmable number of startup transconductance cells disengageable when a specified level of oscillation is reached.

4. A method of energizing an oscillator circuit, comprising:

until a specified level of oscillation for a resonator is reached, selectably engaging at least one of a plurality of startup transconductance cells in a start module;

selectably engaging at least one of a plurality of core transconductance cells in a core module coupled to the resonator and the start module;

upon reaching the specified level of oscillation for the resonator, selectably disengaging the at least one of the plurality of startup transconductance cells in the start module, where selectably disengaging comprises isolating an output of a startup transconductance cell in the start module when the startup transconductance cell is disengaged;

engaging and disengaging the at least one of the plurality of startup transconductance cells responsive to a signal from a corresponding logic gate coupled to the at least one of the plurality of startup transconductance cells; and signaling a logic gate coupled to at least one of the plurality of corresponding startup transconductance cells with a digital start-select code from a start select decoder to selectably engage and disengage the at least one of the plurality of startup transconductance cells.

5. The method for energizing the oscillator circuit of claim 4, where selectably disengaging comprises isolating an output of a core transconductance cell in the core module when the core transconductance cell is disengaged and further comprising engaging and disengaging the at least one of the plurality of core transconductance cells responsive to a signal from a corresponding logic gate coupled to the core transconductance cell.

6. The method for energizing the oscillator circuit of claim 5, further comprising signaling a logic gate coupled to a corresponding core transconductance cell with a digital core-select code from a core select decoder to selectably engage and disengage the core transconductance cell.

* * * * *